United States Patent
Miller et al.

(10) Patent No.: US 7,875,826 B2
(45) Date of Patent: Jan. 25, 2011

(54) VARIABLE WIDTH CONDUCTIVE LINES HAVING SUBSTANTIALLY CONSTANT IMPEDANCE

(75) Inventors: William A. Miller, Camas, WA (US); Morgan Johnson, Portland, OR (US)

(73) Assignee: Efficere, Inc., Vancouver, WA (US)

( * ) Notice: Subject to any disclaimer, the term of this patent is extended or adjusted under 35 U.S.C. 154(b) by 668 days.

(21) Appl. No.: 11/748,257

(22) Filed: May 14, 2007

(65) Prior Publication Data

US 2007/0212878 A1 Sep. 13, 2007

Related U.S. Application Data

(63) Continuation-in-part of application No. 11/104,985, filed on Apr. 11, 2005, now abandoned, which is a continuation of application No. 10/850,021, filed on May 19, 2004, now Pat. No. 6,878,901, which is a continuation of application No. 10/076,178, filed on Feb. 12, 2002, now abandoned.

(60) Provisional application No. 60/268,382, filed on Feb. 12, 2001, provisional application No. 60/277,118, filed on Mar. 19, 2001, provisional application No. 60/277,349, filed on Mar. 19, 2001.

(51) Int. Cl.
*B23K 26/00* (2006.01)

(52) U.S. Cl. .............................. 219/121.61; 219/121.71; 219/121.76

(58) Field of Classification Search ....................... None
See application file for complete search history.

(56) References Cited

U.S. PATENT DOCUMENTS 4,560,962 A * 12/1985 Barrow ........................... 333/1
5,948,718 A * 9/1999 Kanba et al. ................. 501/134

* cited by examiner

*Primary Examiner*—Duy-Vu N Deo
(74) *Attorney, Agent, or Firm*—Marger Johnson & McCollom, P.C.

(57) ABSTRACT

A method of fabricating a conductive line provides a substrate having a blanket layer of conductive material disposed thereon, a removing of a first portion of the blanket layer of conductive material to form one or more gaps that define a first line, the gaps adjacent to the first line, the first line having at least a first segment of a first width and a second segment of a second width, the first and second widths being different, a first increasing of the width of a first gap of the one or more gaps, the first gap adjacent to the first segment, by a first amount, and a second increasing of the width of a second gap of the one or more gaps, the second gap adjacent to the second segment, by a second amount wherein the first and second increasing depend upon a desired electrical characteristic. The first amount and the second amount may be different from each other.

13 Claims, 8 Drawing Sheets

VARIABLE WIDTH CONDUCTIVE LINES HAVING SUBSTANTIALLY CONSTANT IMPEDANCE

RELATED APPLICATIONS

This is a continuation in part of application Ser. No. 11/104,985, filed 11 Apr. 2005; which is a continuation of application Ser. No. 10/850,021, filed 19 May 2004, now U.S. Pat. No. 6,878,901; which is a continuation of application Ser. No. 10/076,178, filed 12 Feb. 2002, now abandoned, which claimed the benefit of provisional application Ser. No. 60/268,382, filed 12 Feb. 2001, provisional application Ser. No. 60/277,118, filed 19 Mar. 2001, and provisional application Ser. No. 60/277,349, filed 19 Mar. 2001.

BACKGROUND

The present disclosure relates to methods and apparatus for providing signal, voltage and ground lines on any layer of a printed circuit board (PCB), ceramic circuit, hybrid, or similar substrate, where those lines have non-constant width over their respective lengths, and where those non-constant width lines have substantially constant impedance.

The electronics industry has used printed circuit boards for many years. A printed circuit board typically includes an insulating substrate having various electrically conductive lines, sometimes called traces. Electrical components reside on the printed circuit board and interconnect by the conductive lines. Until recently, the operating frequencies of circuits formed by the electrical components on the printed circuit boards did not require tight control of the impedance characteristics of the conductive lines. Even if the circuits had required the control, technology for the mass production of low-cost, high-precision printed circuit boards did not exist.

More recently, the operating frequencies of circuits disposed on printed circuit boards have increased dramatically. The successful operation of such circuits often requires interconnection of the electrical components through electrical pathways having particularly specified impedances. With respect to conventional printed circuit board manufacturing processes, generally only one particular width for a conductive line, or trace, provides the specified impedance. In other words, for a given impedance, for example 50 ohms, only one line width will provide the particular impedance. This line width may differ on different layers of a printed circuit board due to factors such as the thickness of the conductive material, typically metal, on different layers, and the different dielectric materials that may surround conductors on different levels of a multi-layer printed circuit board.

Situations often arise in which an electrical pathway, or line, on a printed circuit board must have a width that varies over its length. For example, a line may have a first width where it extends outward from a solder ball pad, and may then narrow to a second width to escape from a dense Ball Grid Array (BGA) package footprint. Similarly, such a line may widen to a third width to traverse a relatively long distance over the printed circuit board, and may narrow again to pass between a pair of vias in the printed circuit board. Those familiar with the layout of conductive lines on printed circuit boards will understand that many circumstances exist where a single conductive line will have a width that varies along the length of its route.

Variations in the width of a conductive line may result in changes in its impedance characteristics, which may consequently result in degradation of the signal integrity as it travels along the line. A need exists for structures, methods and apparatus for forming the structures, formed in and on low-cost printed circuit boards and similar substrates, which have both variable line width and substantially constant impedance.

SUMMARY

One embodiment includes a substrate having a conductive line having two or more segments, where contiguous segments have different widths; and the width of one or more spaces adjacent to at least one segment changes from a nominal width such that a substantially constant impedance characteristic is obtained from the conductive line.

In another embodiment, the appropriate widths for spaces surrounding a conductive line are determined and a material removal system such as, for example, a micromachining system or a chemical etch process, receives this information.

DETAILED DESCRIPTION OF THE EMBODIMENTS

Figure 1A:
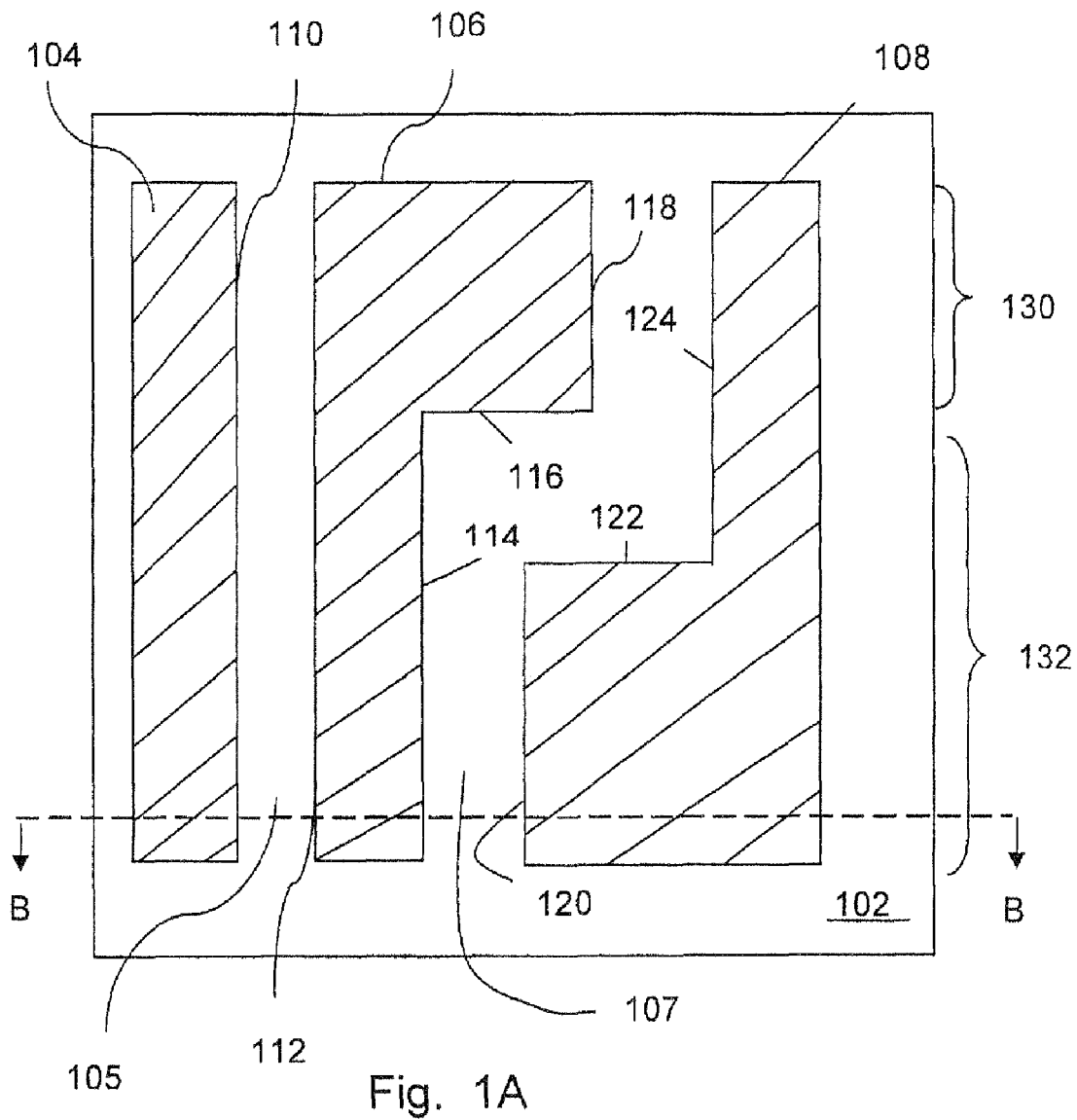
FIG. 1A shows a top view of a representation of conductive lines disposed on an insulating substrate including a non-constant width conductor, which has a first narrow segment and a second wide segment, and which is surrounded by adjacent conductors that are separated from the non-constant width conductor by gaps.

Generally, it is desirable for conductive lines on printed circuit boards, or other substrates, where those conductive lines that have non-constant width along their path lengths, to have substantially constant impedance along their path lengths. The impedance of a line is relates to various characteristics including resistance, inductance, and capacitance. In order to compensate for impedance changes caused by changes in line width, one can change the impedance by modifying the gap widths along at least a portion of a conductive line.

Various embodiments have conductive lines of substantially constant impedance wherein the electrically conductive line has a width that varies along its length. These embodiments compensate for impedance variations, which result from variations in line width, by introducing corresponding corrective changes in associated impedance along the length of the line. More particularly, embodiments provide for variable spacing surrounding the different width segments of a conductive line so as to produce substantially constant impedance characteristics.

For purposes of explanation, specific numbers, materials and configurations are set forth in order to provide a thorough understanding. However, one skilled in the art will understand that one can implement the embodiments without those specific details. In other instances, the discussion omits or simplifies well-known features for ease of discussion.

Reference to "one embodiment", "an embodiment", or similar formulations, means that at least one embodiment includes a particular feature, structure, operation, or characteristic described in connection with the embodiment. Thus, the appearances of such phrases or formulations do not necessarily refer to the same embodiment. Furthermore, one or more embodiments may combine various particular features, structures, operations, or characteristics in any suitable manner.

Terminology

'Chemical etch' refers to a process of masking areas of exposed metal to allow the unmasked regions to be removed by exposure to a chemical process. These conventional processes usually result in sidewalls that are concave (not vertical) and somewhat imprecise.

The discussion may use the expressions 'laser cutting,' 'laser editing,' 'laser etching,' 'laser machining,' 'laser micromachining,' 'laser processing,' 'laser scribing,' and similar terms and expressions interchangeably. These expressions refer to a process of removing material from a workpiece by exposing that workpiece to the output of a laser. The discussion will expressly describe any other use of laser energy. The discussion may refer to chemical etch and laser micromachining as examples of metal removal and shaping processes. The scope of the claims contemplates other processes as well.

The terms 'conductive line,' 'interconnect line,' 'metal line,' 'line,' 'conductive trace,' 'trace,' 'wire,' 'conductor,' 'signal path' and 'signaling medium' all relate to each other. The related terms listed above, are generally interchangeable. This field, and in connection with the electrical structures referred to herein, refers to electrically conductive lines as lines. These lines are typically may result from a metal such as copper, and/or various alloys, stacks of metal and/or metal alloys, or any suitable electrically conductive material.

The term 'space,' as used here, generally refers to a space between electrically conductive lines. Terms such as 'trenches,' 'gaps,' air gaps if no other dielectric material is introduced, or 'slots,' may also refer to those regions between conductors.

This field sometimes refers to the thickness of a conductive layer in terms of ounces (oz.). This results from the weight of one square foot of a conductive layer of a particular material and thickness. For example, a thickness referred to as 0.5 oz. copper is approximately 18 microns thick. Similarly, a thickness referred to as 1.0 oz. copper is approximately 36 microns thick, and so on.

Illustrative Structures

Figure 1B:
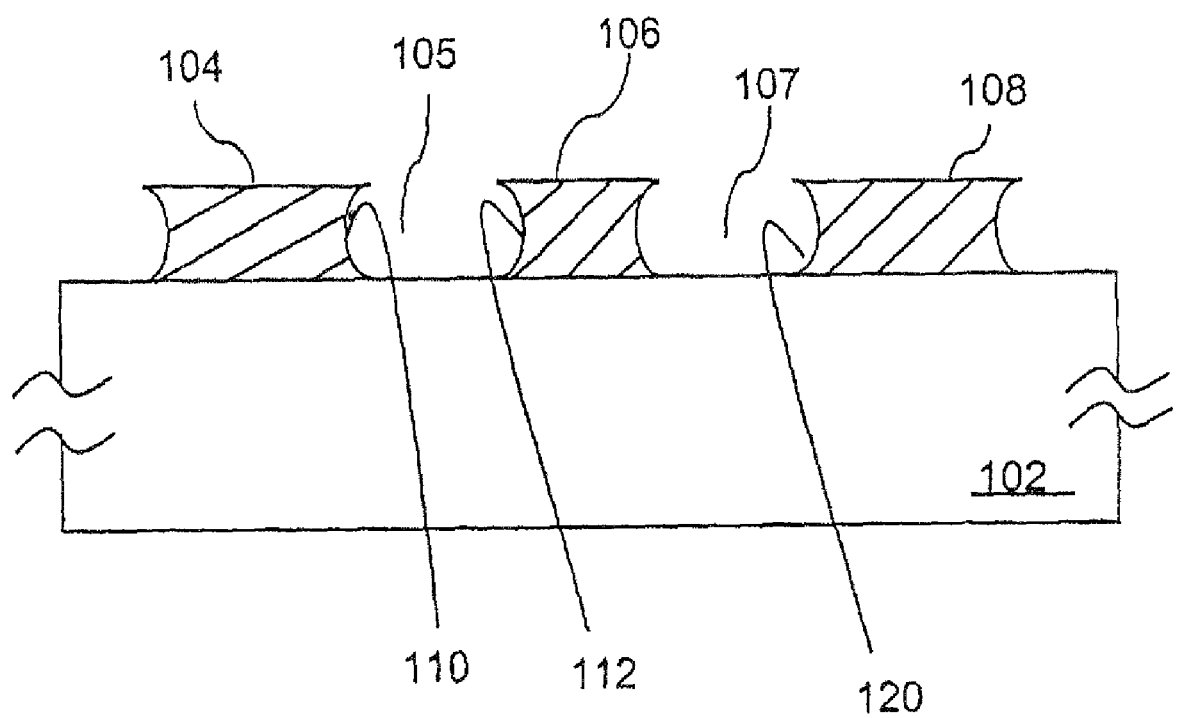
FIG. 1B shows a cross-sectional view of the structure of FIG. 1A taken across section B-B.

FIGS. 1A and 1B show a partially fabricated co-planar wave-guide (CPW) structure that uses very narrow and variable "air gaps" in thick metal, such as ½ oz. to 1 oz. copper foil, to create substantially constant impedance across variable line widths. The fabrication process can adjust the air gaps to maintain a desired impedance, such as 50, 75, 100 Ohms, even if the line changes width, tapers or runs into a pad. In this way, substantially constant impedance can result even though the width of a particular line width is not constant.

Mainstream conventional printed circuit board fabrication methods have not reliably produced these structures since acceptable results require incremental variations of as little as 0.0001 inch. This requirement exceeds the precision of the PCB industry's fabrication methods. This level and method of impedance control has, until now, been restricted to thin film (i.e., $1/16^{th}$ oz. metal) circuits where the line width control has an order of magnitude more precision. Structures in accordance with the present embodiments may apply to any layers of printed circuit boards with the appropriate adjustment for the dielectric constant of the epoxy filling of the gaps on the inner layers.

FIG. 1A shows a top view of a printed circuit board substrate 102 with conductor lines 104, 106, and 108 disposed thereon. In this illustrative example, lines 104, 106, and 108 have the same thickness. Gap 105 separates line 104 from line 106 and gap 107 separates line 106 from line 108. Line 104 has a sidewall 110 facing gap 105 and line 106 has a sidewall 112 facing gap 105. Similarly, line 106 has sidewalls 114, 116, and 118 facing gap 107, and line 108 has sidewalls 120, 122, and 124 facing gap 107. FIG. 1A further shows a first segment 130 wherein line 106 has a first width, and a second segment 132, wherein line 106 has a second width that is different from the first width. FIG. 1B shows a side view of the structure of FIG. 1A taken along section B-B. Conductors 104, 106 and 108 have sidewalls that are not vertical. Such sidewall geometries make it difficult to precisely determine the capacitance between two conductors separated by a gap such as gaps 105 or 107. FIGS. 1A and 1B illustrate conductors subsequent to etching and prior to gap adjustment to control impedance.

Manufacturing processes typically have well-known variances in their materials and operations that result in non-uniformities both within a particular printed circuit board, and between printed circuit boards of the same design. These non-uniformities may manifest themselves in a number of ways, including variances in the impedance characteristics of conductive lines. More particularly, the impedance of a line on a printed circuit board relates to the width and thickness of the line, as well as to the width and height of the spaces, or both, separating that line from adjacent conductors.

Generally, conventional etching processes for printed circuit boards produce lines having sidewalls typically concave in shape, and thus not perpendicular to the substrate. Clearly, with the sidewalls being uneven, accurate determination the true width of the spaces surrounding the lines become difficult. Conventional processes only permit an approximation of the width of the spaces, resulting in only an approximation of the impedance. This situation results in impedance specifications with significant variances. This level of variation in impedance limits the performance of circuit operations.

Some embodiments provide for a laser micromachining operation so as to produce substantially vertical sidewalls on the conductive line of interest and on the corresponding sidewalls of adjacent conductors. In this way, opposing sidewalls that bound the gap between conductors become substantially parallel to one another providing both reduced manufacturing variances, and the ability to accurately predetermine the impedance of such lines.

Figure 2A:
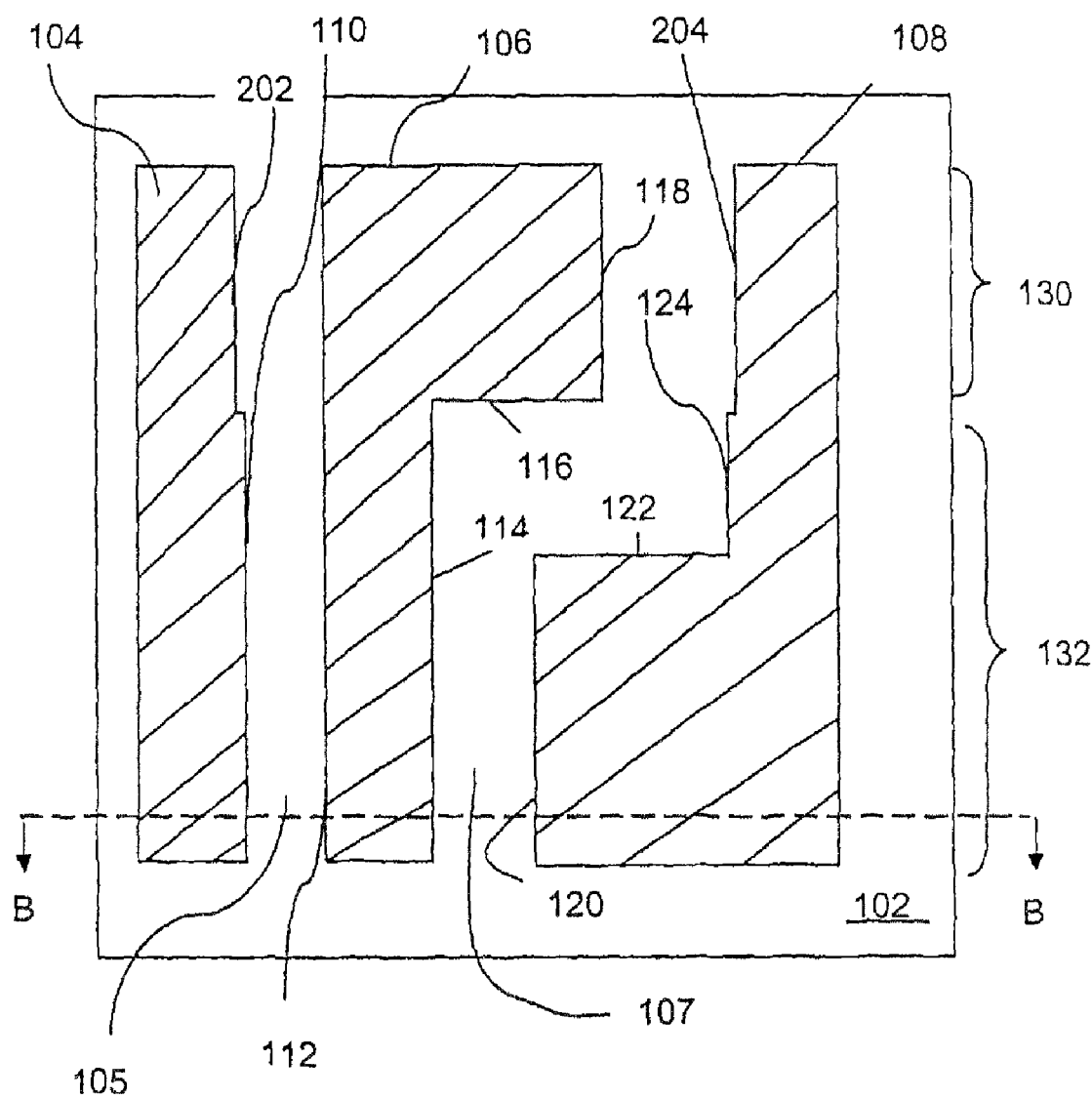
FIG. 2A shows a top view of a structure of after a gap width adjustment has been made.
Figure 2B:
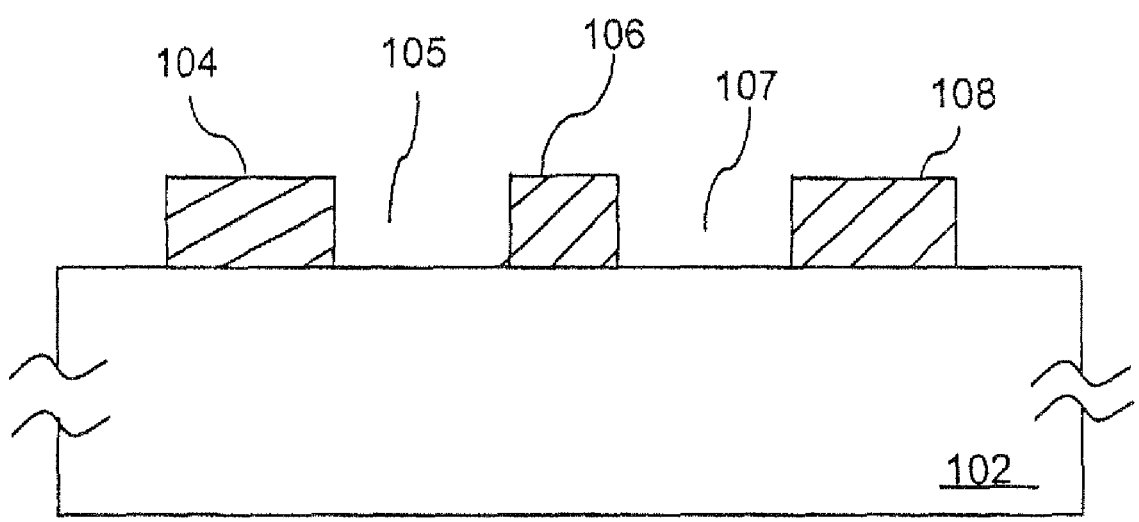
FIG. 2B shows a cross-sectional view of the structure of FIG. 2A taken across section B-B.

FIGS. 2A and 2B illustrate the structures of FIGS. 1A and 1B respectively, after sidewall parallelization and gap width adjustment. Referring to FIG. 2A, an adjustment process has modified conductor 104 along a portion of sidewall 110 to produces a notch 202 that increases the width of gap 105 over 130. The process has modified conductor 108 along a portion of sidewall 118 to produce a notch 204 that increases the width of the gap 107. Increasing the gap widths in this way adjusts the capacitance of the line 106 between segment 130 and the surrounding conductors. FIG. 2B shows a cross-sectional view demonstrating that the sidewall of the conductors has become vertical enabling precise gap measurement and precise impedance control.

Reducing the width of the line 106 may also achieve a change in capacitance. However, reducing the width of line 106 increases its impedance and so determining the final gap must take that increase into account. Similarly, altering any combination of sidewalls of the line of interest and the surrounding adjacent conductors may achieve impedance modifications.

Figure 3:
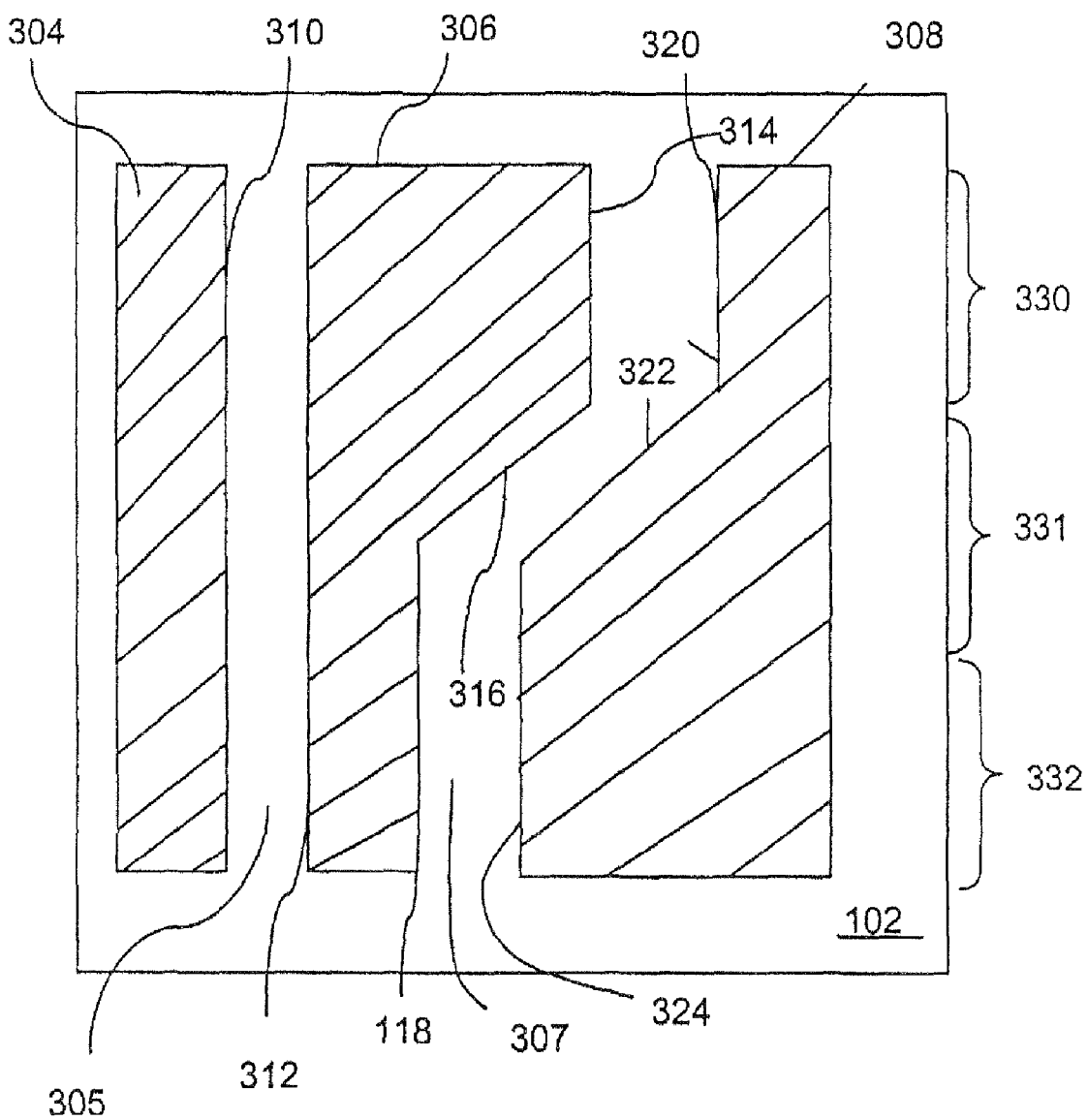
FIG. 3 shows a top view of a structure having a transition region of conductive material included between first and second line segments.
Figure 4:
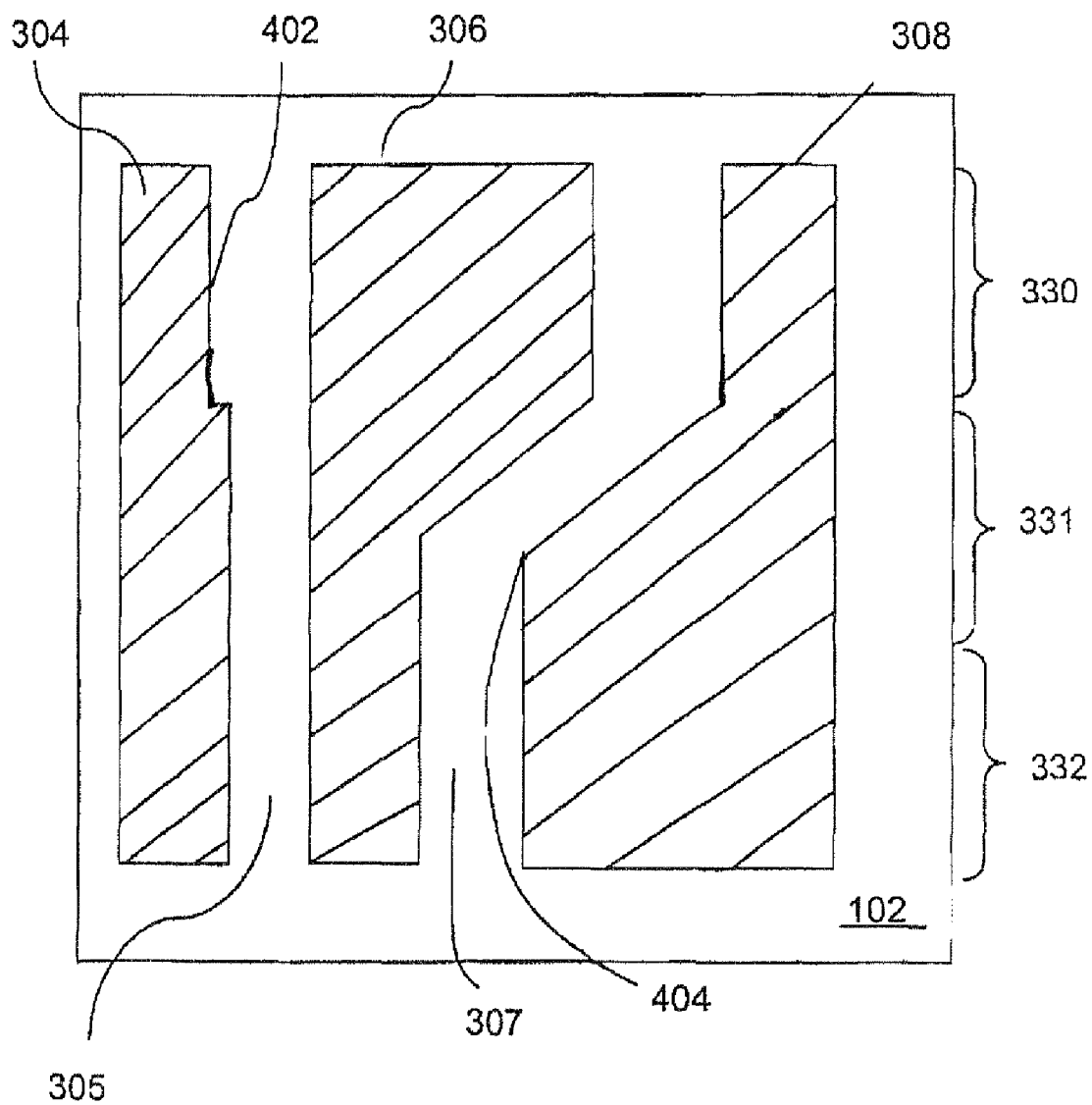
FIG. 4 shows a top view of a structure after a gap width adjustment has been made.

FIGS. 3 and 4 are similar to FIGS. 1A and 2A, except that a transition segment 331 of conductive material exists between the first and second segments which have different widths. More particularly, FIG. 3 shows a top view of a printed circuit board substrate 102 having conductor lines 304, 306, and 308. In this illustrative example, lines 304, 306, and 308 have the same thickness. Gap 305 separates line 304 from line 306 and gap 307 separates line 306 from line 308. Line 304 has a sidewall 310 facing gap 305 and line 306 has a sidewall 312 facing gap 305. Similarly, line 306 has sidewalls 314, 316, and 318 facing gap 307, and line 308 has sidewalls 320, 322, and 324 facing gap 307. FIG. 3 further shows a first segment 330 wherein line 306 has a first width, a second segment 331 in which line 306 has a linearly narrowing transition portion, and a third segment 332, in which line 306 has a second width that is different from the first width. FIG. 3 illustrates conductors subsequent to conventional etching and prior to gap adjustment.

FIG. 4 shows a structure subsequent to a gap width adjustment operation. As can be seen in FIG. 4, material has been removed from line 304 to form notch 402, which is opposite first segment 330 of line 306. Additionally, material has been removed from line 308 so as to form notch 404, which is opposite second and third segments 331, 332 of line 306. Increasing the width of gaps 305 and 307 reduces capacitance between line 306, and lines 304 and 308. In this way, the impedance of line 306 is maintained substantially constant even though the impedance of line 304 varies with changes in its width. Generally, conventional printed circuit board manufacturing methods for thick metal cannot produce notches 402, 404 with the required level of accuracy to properly compensate for the changes in resistance per unit length of line 306.

The present embodiments have utility with regard to single ended signal paths, differential signal paths, and bus oriented signal paths. Various embodiments can accommodate line features such as pads, stubs, narrowing, broadening, and even adjustments for corner turning.

Variable line widths applied to differential signals have particular value in reducing both impedance mismatch and signal degradation due to common mode coupling. The narrow air gap between differential lines helps to isolate such lines from external noise. With respect to differential signals, the small air gap provided by the embodiments results in tighter coupling. Further, by their nature, embodiments reduce effects of noise from common mode coupling by increasing the likelihood of rejection of the noise by the pair.

Variable Width Spaces

Tailoring gap spacing may make adjustments in the capacitance values adjacent various segments of a conductive line compensates for the impedance changes that would otherwise result from variations in the width of the conductive line. In some embodiments, a printed circuit board, which has been previously etched to form conductive lines thereon, undergoes further processing to modify the gap widths. In some alternative embodiments, a printed circuit board with a blanket layer of conductive material undergoes further processing to create the gaps that define various individual conductive lines, and these gaps vary in width such that the impedance of a variable width line is substantially constant.

It will be appreciated that the various embodiments may use substrates and adjustment processes other than printed circuit boards.

Determination of Gap Spacing

Generally, for a line that requires substantially constant impedance along its path length, analysis of the set of layout coordinates of the line, or an equivalent description, identifies segments of the path that have different widths. In this scenario, part of the design information that describes the layout of the line provides an impedance specification. A two-dimensional field solver analyzes each segment taking as its input, parameters such as the width and thickness of the conductive line segment, the nominal gap width on each laterally adjacent side of the line segment, and the dielectric constant of the material that will fill those gaps, such as air.

The output of the two-dimensional field solver provides a prediction of the impedance of the line segment. If the predicted value differs from the specified value, then an analysis determines the extent to which the gap widths should be adjusted in order to make the predicted impedance of the line segment closer to the specified impedance. This process may repeat for each segment of the line. The information regarding gap width changes becomes part of the layout database or computer aided manufacturing (CAM) file used in the manufacturing process to remove material from conductors. The removal of material creates gaps surrounding the line segment of interest in order to produce the desired line segment width and adjacent gap widths.

Figure 5:
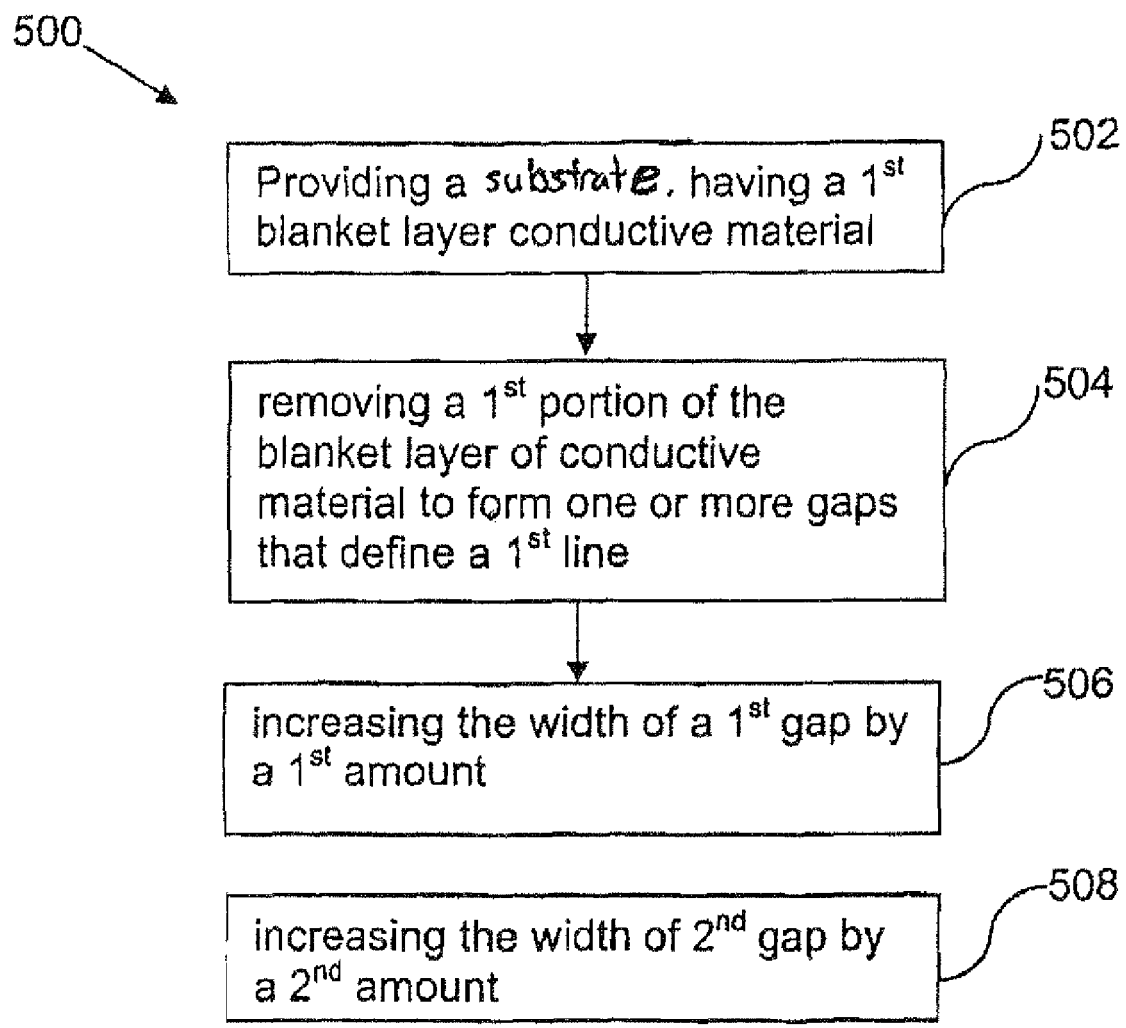
FIG. 5 shows a flow diagram of a method of fabricating a conductive line.

Referring to FIG. 5, an illustrative process 500 is described. More particularly, a process 500 of fabricating a conductive line, includes providing a substrate having a blanket layer of conductive material at 502, removing a first portion of the blanket layer of conductive material at 504 to form one or more gaps that define a first line, the gaps being adjacent to the first line, the first line having at least a first segment of a first width and a second segment of a second width, the first and widths being different. The process includes first increasing the width of a first gap of the one or more gaps at 506, the first gap adjacent to the first segment, by a first amount, and second increasing the width of a second gap of the one or more gaps at 508, the second gap adjacent to the second segment, by a second amount. The first amount and the second amount differ from each other, and the first amount depends at least in part on the first width, and the second amount depends at least in part on the second width. The substrate may consist of a printed circuit board, or any other suitable insulating substrate.

In an alternative embodiment, each of the gaps may result from a single material removal operation rather than two separate material removal operations. In other words, a two-operation process may include a first etching of a blanket layer of material, such as by chemical etching, followed by a second etching, such as by laser etching, wherein the laser etching provides gap width adjustments with a higher level of precision than possible from chemical etching. By contrast, a single-operation process may form the gaps, with the appropriate adjustments for impedance control provided by, for example, laser micromachining. The expression "single-operation" does not preclude multiple passes, or multiples pulses, by a laser or other removal/etching system to remove the material needed to form the gaps.

In yet another alternative embodiment, the removing, first increasing and second increasing may all be accomplished in one process within the manufacturing process.

Many electronic design tools, typically software, exist that assist with the creation of, or completely synthesize, a printed circuit board layout. Data that describes the polygons or shapes, which make up the conductive lines of the fully manufactured printed circuit boards, represents the layout. This design information may also include additional items, such as, but not limited to, the location and size of vias on the printed circuit board. The process may use the layout information to produce masking layers for use in chemically etching blanket layers of conductive material on a substrate, or to drive an etching system, such as a laser etching or micromachining system, to directly remove material from a blanket layer of material on a substrate. Known algorithms may process the information, or layout coordinates, which describe the conductive lines to ascertain the width and spacings of various conductive lines on a printed circuit board.

Figure 6:
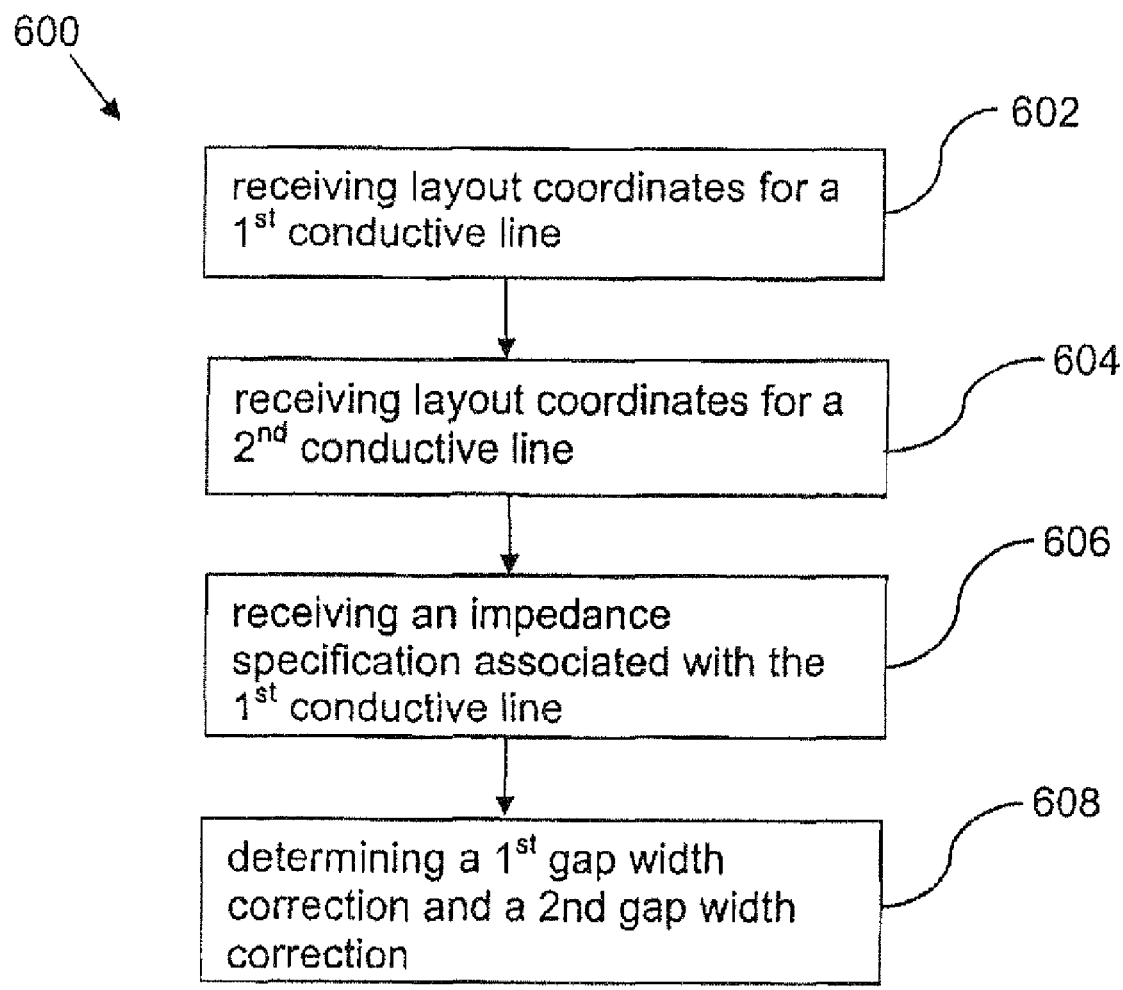
FIG. 6 shows a flow diagram of a method of controlling a material removal system.

FIG. 6 shows a process 600 for controlling a material removal system that includes, receiving layout coordinates for a first conductive line at 602, the first conductive line having at least a first segment and a second segment, the first and second segments having different widths, receiving layout coordinates for a second conductive line at 604, the second conductive line spaced apart from the first segment and the second segment by a predetermined amount, receiving an impedance specification associated with the first conductive line at 606, and determining a first gap width correction between the first segment and the second conductive line at 606, and a second gap width correction between the second segment and the second conductive line.

CONCLUSION

This discussion has described various illustrative methods and structures. Some embodiments provide relatively narrow, variable width "air gaps" in thick metal such as 18 microns to 36 microns in thickness, in order to produce substantially constant impedance across the length of a variable width conductive line. Some methods determine changes that need to be made to conductive lines and/or adjacent conductors in order to provide substantially constant impedance characteristics in a line that has a non-constant line width.

Some embodiments include simplifying the task of layout design to meet a given performance target; and providing greater routing density for that performance target as compared to conventional approaches.

Some embodiments reduce that clock skew across complex clock trees.

Some embodiments reduce power consumption.

Thus, although there has been described to this point a particular embodiment for a method and apparatus for variable line width constant impedance conductive lines, it is not intended that such specific references be considered as limitations upon the scope of this invention except in-so-far as set forth in the following claims.

What is claimed is:

1. A method of fabricating a conductive line, comprising:
   providing a substrate having a blanket layer of conductive material disposed thereon;
   removing of a first portion of the blanket layer of conductive material so as to form one or more gaps that define a first line, the gaps being adjacent to the first line, the first line having at least a first segment of a first width and a second segment of a second width, the first and second widths being different;
   increasing of the width of a first gap of the one or more gaps by removal of one of either a first portion of the first line or a second portion of the blanket layer, the first gap adjacent to the first segment, by a first amount; and
   increasing of the width of a second gap of the one or more gaps by removal of one of either a second portion of the first line or a third portion of the blanket layer, the second gap adjacent to the second segment, by a second amount wherein the first and second increasing depend upon a desired electrical characteristic;
   wherein the first amount and the second amount are different from each other, and the first amount is determined based at least in part on the first width, and the second amount is determined based at least in part on the second width.

2. The method of claim 1, wherein the conductive material comprises copper.

3. The method of claim 1, wherein the conductive material comprises a stack of two or more electrically conductive materials.

4. The method of claim 1, further comprising, prior to increasing the width of the first gap, measuring at least one electrical characteristic of a structure disposed on the substrate.

5. The method of claim 1, wherein the increasing of the width of the first gap comprises removing material from a first outer edge of the first segment, the first outer edge of the first segment disposed adjacent the first gap.

6. The method of claim 5, wherein the increasing of the width of the second gap comprises removing material from a first outer edge of the second segment, the first outer edge of the second segment disposed adjacent the second gap.

7. The method of claim 1, wherein the increasing of the width of the first gap comprises removing material from portions of the blanket layer adjacent the first gap.

8. The method of claim 1, wherein the increasing of the width of the second gap comprises removing material from portions of the blanket layer adjacent the second gap.

9. The method of claim 1, wherein either the increasing of the width of the first gap or the increasing of the width of the second gap comprises removing material from portions of a second line adjacent the first line.

10. The method of claim 4, further comprising forming the structure.

11. The method of claim 10, wherein forming the structure comprises laser micromachining.

12. The method of claim 4, wherein forming the structure further comprising chemically etching.

13. The method of claim 1, wherein the removing, increasing the width of the first gap and increasing the width of the second gap are performed in one process.

\* \* \* \* \*